United States Patent
Lemon et al.

(10) Patent No.: US 9,926,623 B2
(45) Date of Patent: Mar. 27, 2018

(54) METHODS OF FORMING MOLYBDENUM SPUTTERING TARGETS

(71) Applicants: Brad Lemon, Battle Creek, MI (US); Joseph Hirt, Cypress, TX (US); Timothy Welling, Portage, MI (US); James G. Daily, III, Marshall, MI (US); David Meendering, Coldwater, MI (US); Gary Rozak, Akron, OH (US); Jerome O'Grady, Hudson Village, OH (US); Prabhat Kumar, Framingham, MA (US); Steven A. Miller, Canton, MA (US); Rong-chein Richard Wu, North Chelmsford, MA (US); David G. Schwartz, Mentor, OH (US)

(72) Inventors: Brad Lemon, Battle Creek, MI (US); Joseph Hirt, Cypress, TX (US); Timothy Welling, Portage, MI (US); James G. Daily, III, Marshall, MI (US); David Meendering, Coldwater, MI (US); Gary Rozak, Akron, OH (US); Jerome O'Grady, Hudson Village, OH (US); Prabhat Kumar, Framingham, MA (US); Steven A. Miller, Canton, MA (US); Rong-chein Richard Wu, North Chelmsford, MA (US); David G. Schwartz, Mentor, OH (US)

(73) Assignee: H.C. STARCK INC., Newton, MA (US)

(*) Notice: Subject to any disclaimer, the term of this patent is extended or adjusted under 35 U.S.C. 154(b) by 260 days.

(21) Appl. No.: 15/061,566

(22) Filed: Mar. 4, 2016

(65) Prior Publication Data

US 2016/0186311 A1 Jun. 30, 2016

Related U.S. Application Data

(63) Continuation of application No. 14/608,995, filed on Jan. 29, 2015, now Pat. No. 9,309,591, which is a
(Continued)

(51) Int. Cl.
*C23C 14/34* (2006.01)
*B22F 3/16* (2006.01)
(Continued)

(52) U.S. Cl.
CPC ........ *C23C 14/3414* (2013.01); *B22F 1/0003* (2013.01); *B22F 3/16* (2013.01);
(Continued)

(58) Field of Classification Search
CPC .... C23C 14/34; B22F 1/00; B22F 3/16; B22F 5/00; B22F 3/24; C22F 1/18; C22C 27/04
See application file for complete search history.

(56) References Cited

U.S. PATENT DOCUMENTS

| 5,906,717 A | 5/1999 | Hasegawa et al. |
| 6,183,614 B1 | 2/2001 | Fu |

(Continued)

FOREIGN PATENT DOCUMENTS

| JP | 03150356 A | 6/1991 |
| JP | 2000045066 A | 2/2000 |

OTHER PUBLICATIONS

Bereznai et al., "Reactive Pulsed Laser Deposition of Thin Molybdenum-and Tungsten-Nitride Films," Thin Solid Films 473 Availabel Online, pp. 16-23 (2004).
(Continued)

*Primary Examiner* — Jessee Roe
(74) *Attorney, Agent, or Firm* — Morgan, Lewis & Bockius LLP

(57) ABSTRACT

In various embodiments, sputtering targets are formed by introducing molybdenum powder into a sheet bar mold,
(Continued)

pressing the powder to form a sheet bar, sintering the sheet bar to form an ingot having a density of at least 90% of a theoretical density, preheating the ingot, rolling the ingot to form a plate, and heat treating the plate.

25 Claims, 8 Drawing Sheets

Related U.S. Application Data continuation of application No. 13/849,918, filed on Mar. 25, 2013, now Pat. No. 9,017,600, which is a continuation of application No. 13/340,973, filed on Dec. 30, 2011, now Pat. No. 8,425,833, which is a continuation of application No. 11/574,469, filed as application No. PCT/US2005/030852 on Aug. 29, 2005, now Pat. No. 8,088,232, which is a continuation of application No. 10/931,203, filed on Aug. 31, 2004, now abandoned.

(51) Int. Cl.
*C22C 1/04* (2006.01)
*C22C 27/04* (2006.01)
*C23C 14/35* (2006.01)
*C23C 14/46* (2006.01)
*B22F 1/00* (2006.01)
*B22F 5/00* (2006.01)
*C21D 8/02* (2006.01)
*C22F 1/18* (2006.01)
*C23C 14/14* (2006.01)
*B22F 3/24* (2006.01)

(52) U.S. Cl.
CPC ............... *B22F 3/162* (2013.01); *B22F 3/24* (2013.01); *B22F 5/006* (2013.01); *C21D 8/0221* (2013.01); *C21D 8/0247* (2013.01); *C22C 1/045* (2013.01); *C22C 27/04* (2013.01); *C22F 1/18* (2013.01); *C23C 14/14* (2013.01); *C23C 14/3478* (2013.01); *C23C 14/3485* (2013.01); *C23C 14/35* (2013.01); *C23C 14/46* (2013.01); *B22F 2003/248* (2013.01); *B22F 2301/20* (2013.01); *B22F 2998/00* (2013.01); *B22F 2998/10* (2013.01)

(56) References Cited

U.S. PATENT DOCUMENTS

| | | | |
|---|---|---|---|
| 6,238,494 | B1 | 5/2001 | Segal |
| 6,342,133 | B2 | 1/2002 | D'Couto et al. |
| 7,158,206 | B2 | 1/2007 | Kim et al. |
| 8,088,232 | B2 | 1/2012 | Lemon et al. |
| 8,425,833 | B2 | 4/2013 | Lemon et al. |
| 9,017,600 | B2 | 4/2015 | Lemon et al. |

OTHER PUBLICATIONS

Krenn et al., "Ideal Strengths of BCC Metals," Materials Science and Engineering A319-321, pp. 111-114 (2001).
Michaluk et al., "Affect of Localized Texture on Sputter Performance of Tantalum," ICOTOM 12: 12th International Conference on Textures of Materials; Montreal, Quebec; Canada; pp. 9-13 (1999).
Thorton et al., "Internal Stresses in Titanium, Nickel, Molybdenu, and Tantalum Films Deposited by Cylindrical Magnetron Sputtering," J. Vac. Sci. Technol., vol. 14, No. 1, pp. 164-168 (1977).

REMOVAL OF CD
AFFECTED MATERIAL

METHODS OF FORMING MOLYBDENUM SPUTTERING TARGETS

RELATED APPLICATIONS

This application is a continuation of U.S. patent application Ser. No. 14/608,995, filed on Jan. 29, 2015, now U.S. Pat. No. 9,309,951, which is a continuation of U.S. patent application Ser. No. 13/849,918, filed on Mar. 25, 2013, now U.S. Pat. No. 9,017,600, which is a continuation of U.S. patent application Ser. No. 13/340,973, filed on Dec. 30, 2011, now U.S. Pat. No. 8,425,833, which is a continuation of U.S. patent application Ser. No. 11/574,469, filed on Jun. 21, 2007, now U.S. Pat. No. 8,088,232, which is the U.S. national stage application of International (PCT) Patent Application Serial No. PCT/US2005/030852, filed Aug. 29, 2005, which claims the benefit of U.S. patent application Ser. No. 10/931,203, filed Aug. 31, 2004, now abandoned. The entire disclosure of each of these applications is incorporated by reference herein.

TECHNICAL FIELD OF THE INVENTION

The present invention relates to forms of molybdenum, their use as sputtering targets and method of their manufacture.

BACKGROUND OF THE INVENTION

The sputtering technique is a film-forming technique with which a plasma is utilized to generate ions striking a sputtering target so as to result in atoms of the sputtering target depositing on a substrate as a film. The sputtering technique is particularly used to produce a metallic layer in various manufacturing processes used in the semiconductor and the photoelectric industries. The properties of films formed during sputtering is related to the properties of the sputtering target itself, such as the size of the respective crystal grain and the formation of secondary phase with distribution characteristics.

Various sputtering techniques are used in order to effect the deposition of a film over the surface of a substrate. Deposited metal films, such as metal films on a flat panel display device, can be formed by a magnetron sputtering apparatus or other sputtering techniques. The magnetron sputtering apparatus induces plasma ions of a gas to bombard a target, causing surface atoms of the target material to be ejected therefrom and to be deposited as a film or layer on the surface of a substrate. Conventionally, a sputtering source in the form of a planar disc or rectangle is used as the target, and ejected atoms travel along a line-of-sight trajectory to deposit on top of a wafer whose deposition face is parallel to the erosion face of the target.

However, a tubular-shaped sputtering target can also be used. In this case, the plasma is external and the atoms are sputtered from the exterior of the tube. The flat substrate is slowly passed over the target. Typically, its motion is horizontal, and in a direction at a right angle to the target axis, which is also horizontal. Thus the substrate can be gradually coated as it passes over the target.

In many cases, sputtering targets, particularly those containing molybdenum, have a wrought microstructure with non-uniform grain texture, which may change from one sputtering target to the next. These "non-uniformities" lead to non-uniform films being deposited onto substrates and devices, particularly flat panel displays that do not operate optimally.

In other cases, molybdenum-based sputtering targets are manufactured using a conventional thermomechanical working step. Unfortunately, this methodology generally induces heterogeneity of grain size and texture. The heterogeneity in the sputtering targets typically leads to sputtered films that do not possess the uniformity desired in most semiconductor and photoelectric applications.

In some applications, large plates of pure molybdenum are required as sputtering targets. In such cases, the production of large plates is accomplished through the machining and assembly of multiple plates, often referred to as segmented plates. The preparation of segmented plates requires an increased amount of machining and assembly cost compared to the production of a single plate ingot. Additionally, the assembly of different plates creates variability in the large segmented plate, which can cause unacceptable variability in films formed by sputtering the large plate target.

Therefore, there is a need in the art for molybdenum sputtering targets that overcome the deficiencies of the prior art and have a fine grain size and uniform grain texture.

SUMMARY OF THE INVENTION

The present invention is directed to molybdenum, sputtering targets characterized as having no or minimal texture banding or through thickness gradient. The molybdenum sputtering targets having a fine, uniform grain size as well as uniform texture, have high purity and can be micro-alloyed to improved performance.

The present invention is additionally directed to a tubular-shaped sputtering target formed by:
A) placing molybdenum powder in a mold and pressing the powder at a pressure of from 200 to 250 MPa and sintering the pressed piece at a temperature of from 1780 to 2175° C. to form a billet;
B) removing the center of the billet to form a tubular billet having an inner diameter $ID_t$ and an outer diameter $OD_t$;
C) working the tubular billet to form a worked billet having an inner diameter ID and an outer diameter $OD_f$ such that the ratio of $OD_t$ to $OD_f$ is at least 3:1; and
D) heat treating the tubular billet at a temperature of from 815 to 1375° C.

The present invention is also directed to a tubular-shaped sputtering target containing molybdenum having a uniform texture, which features particularly a 110 orientation parallel to the longitudinal direction and a 111 orientation relative to the radial direction.

The present invention is additionally directed to a method of making a tubular sputtering target that includes:
A) placing molybdenum powder in a mold and pressing the powder at a pressure of from 200 to 250 MPa and sintering the pressed piece at a temperature of from 1780 to 2175° C. to form a billet;
B) removing the center of the billet to form a tubular billet having an inner diameter $ID_t$ and an outer diameter $OD_t$;
C) working the tubular billet to form a worked billet having an inner diameter ID and an outer diameter $OD_f$ such that the ratio of $OD_t$ to $OD_f$ is at least 3:1; and
D) heat treating the tubular billet at a temperature of from 815 to 1375° C.

Embodiments of the present invention are directed to a disc-shaped sputtering target formed by:
I) placing molybdenum powder in a mold and pressing the powder at a pressure of from 200 to 250 MPa and sintering the pressed piece at a temperature of from 1780 to 2175° C. to form a billet having a diameter of $D_o$;

II) extruding the billet to form an extruded billet having a diameter of $D_2$ such that the ratio of $D_o$ to $D_2$ is from 3:1 to 5:1;

III) applying a first heat treatment to the extruded billet at a temperature of from 900 to 1300° C.;

IV) upset forging the extruded billet at a temperature of from 870 to 1200° C. to form a forged billet having a diameter $D_f$ such that the ratio of $D_f$ to $D_2$ is from 1.5:1 to 3:1; and V) applying a second heat treatment to the forged billet at a temperature of from 1200 to 1400° C.

Embodiments of the invention are also directed to a disc-shaped sputtering target containing molybdenum having a uniform grain and texture.

Other embodiments of the invention are directed to large molybdenum plates having a non-segmented construction, weighing at least 300 kg, and containing at least 99% by weight of molybdenum.

Additional embodiments of the invention are directed to a process for preparing the above-described plates, which includes the steps of:

i) pouring powder into a sheet bar mold;

ii) consolidating the powder by cold isostatic pressing (C.I.P.) at a pressures of from 100 to 250 MPa (15 to 36 ksi) to form a sheet bar;

iii) sintering the sheet bar at a temperature of at least 1600° C. to form an ingot having a density of at least 90% of the theoretical density;

iv) preheating the ingot at a temperature of from 1100 to 1450° C.;

v) hot rolling the ingot at a temperature of from 1050 to 1400° C. to effect a reduction in the thickness and an increase in the length of the ingot; and vi) heat treating the rolled ingot at a temperature of from 850 to 950° C.

The present invention is further directed to sputtering targets and sintering tiles that include the above-described molybdenum plate.

The present invention is additionally directed to a method of sputtering that includes subjecting any of the above-described sputtering targets to sputtering conditions and thereby sputtering the target.

The present invention is further directed to a method of sputtering that includes subjecting the above-described sputtering target to sputtering conditions and thereby sputtering the target.

The present invention is further directed to a method for making a thin film including the steps of:

(a) sputtering the above-described sputtering target;

(b) removing Mo atoms from the target; and (c) forming a thin film comprising molybdenum onto a substrate.

The present invention also provides a thin film made in accordance with the above-described method. The thin films can be used in electronic components such as semiconductor devices, thin film transistors, TFT-LCD devices, black matrix devices that enhance image contrast in Flat Panel Displays, solar cells, sensors, and gate device for CMOS (complementary metal oxide semiconductor) with tunable work functions.

DETAILED DESCRIPTION OF THE INVENTION

Figure 1:
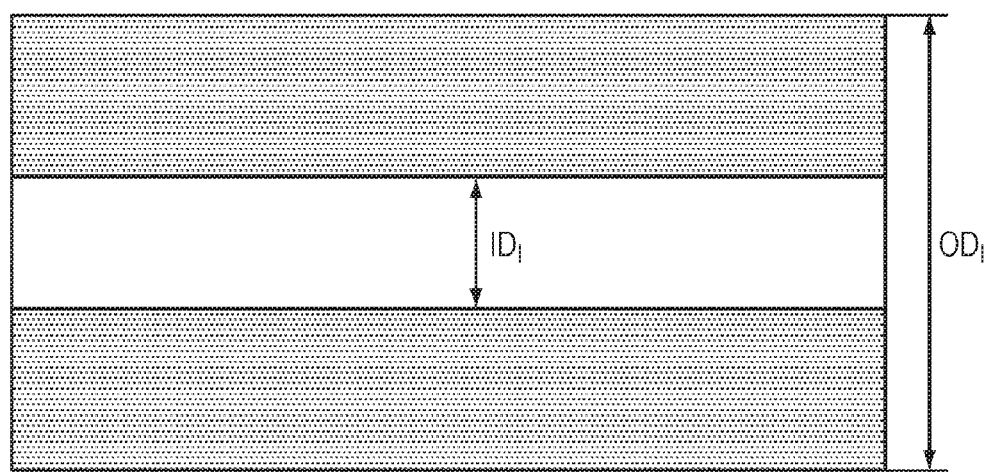
FIG. 1 is a schematic view of a consolidated hollow billet according to the invention.

Other than in the operating examples or where otherwise indicated, all numbers or expressions referring to quantities of ingredients, reaction conditions, etc., used in the specification and claims are to be understood as modified in all instances by the term "about." Various numerical ranges are disclosed in this patent application. Because these ranges are continuous, they include every value between the minimum and maximum values. Unless expressly indicated otherwise, the various numerical ranges specified in this application are approximations.

As used herein, the term "banding" refers to non-uniformities in the grain or texture, the grain size, or grain orientation that occur in a strip or pattern along the surface of the sputtering target. As used herein, the term "through thickness gradient" refers to changes in grain or texture, grain size, or grain orientation moving from the edge of the target to the center of the target.

The forms of molybdenum, sputtering targets described herein below are characterized as having no or minimal banding or through thickness gradient. As such, the present invention is directed to molybdenum sputtering targets having fine, uniform grain size as well as uniform texture, substantially free of both texture banding and through thickness gradient from a center to an edge of the target, with high purity and optionally micro-alloyed for improved performance.

In the present invention, the molybdenum sputtering targets are very pure, as such, the molybdenum sputtering targets have a purity of at least 99.5%, in some cases 99.9%, n other cases 99.95%, in some instances at least 99.99% and in other instances at least 99.999%. As used herein, the term "purity" refers to the weight percentage of molybdenum in the sputtering target.

The present invention provides a tubular-shaped sputtering target and its method of manufacture. The present method involves the use of pure molybdenum powder as a starting material, and its consolidation to a substantially fully dense article in the form of a tube. The tubular form produced has a fine, uniform grain size, and a texture which is substantially uniform throughout, and does not change from tube to tube. Such tubular forms yield thin films that have the required purity, and a thickness which is both easily predictable and uniform across the area of a given substrate.

In an embodiment of the invention, the tubular-shaped sputtering target has a texture that is substantially free of banding and substantially free of any through thickness gradient.

According to the present invention, a tubular-shaped sputtering target is formed by the pressing and sintering of molybdenum powder to form a billet, removing the center of the billet, working the billet, and heat treating the billet to form a tubular-shaped sputtering target.

In the present invention, ammonium dimolybdate is selected to meet required purity specifications, and then reduced to molybdenum metal powder in hydrogen using conventional hydrogen reduction processes. The ammonium dimolybdate can be at least 95% pure, in some cases at least 99% pure, in other cases at least 99.5% pure and in certain instances 99.999% pure. The purity of the ammonium dimolybdate can range between any of the values recited above.

Typically, the molybdenum powder is placed in a mold and the powder is pressed at a pressure of at least 16 ksi, in some cases at least 30 ksi and in other cases at least 32 ksi. Also, the powder can be pressed at a pressure of up to 40 ksi, in some cases up to 37 ksi and in other cases up to 35 ksi. The molybdenum powder in the mold can be pressed at any pressure recited above or at pressures ranging between any of the pressures recited above.

Further, when the pressed billet is sintered in the mold, it is sintered at a temperature of at least 1785° C., in some cases at least 1800° C. and in other cases at least 1850° C. Also, the pressed billet can be sintered at a temperature of up to 2200° C., in some cases up to 2175° C. and in other cases up to 2150° C. The pressed molybdenum billet in the mold can be sintered at any temperature recited above or at temperatures ranging between any of the temperatures recited above.

In an embodiment of the invention, the pressing is performed isostatically. In another embodiment of the invention, the powder is sintered in hydrogen.

As shown in FIG. 1, the center of the consolidated billet is removed through trepanning such that the $ID_t$ is smaller than the inside diameter of the finished tubular form. The $OD_t$ is selected such that the ratio of reduction in cross-sectional area normal to the billet length is at least 3:1, in some cases at least 3.5:1 and in other cases at least 4:1. Also, the reduction in cross-sectional area normal to the billet length can be up to 12:1, in some cases up to 10:1 and in other cases up to 8:1. In a particular embodiment of the invention, the reduction in cross-sectional area normal to the billet length is 4.9:1 or higher. The reduction in cross-sectional area normal to the billet length can be any of the values or range between any of the values recited above.

The tubular billet is worked to form a worked billet having an inner diameter ID and an outer diameter $OD_f$ such that the ratio of $OD_t$ to $OD_f$ is as described above.

Figure 2:
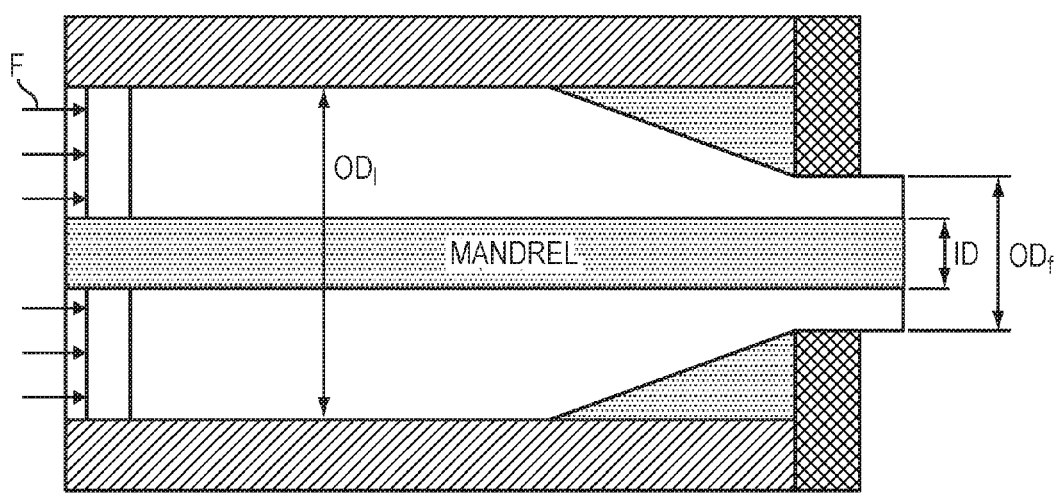
FIG. 2 is a schematic view of a hollow billet being extruded according to the present invention for extrusion of a tube.

In an embodiment of the invention, the tubular billet is worked by extruding the billet, as shown in FIG. 2. In this embodiment, the billet is extruded with a reduction ratio (created by the change of $OD_t$ to $OD_f$) in cross-sectional area as described above. The billet length may be variable. The product form ID is controlled through the use of mandrel tooling.

In a particular embodiment of the invention, the tubular billet can be extruded at a temperature of at least 925° C., in some cases at least 950° C., and in other cases at least 1000° C. Also, the tubular billet can be extruded at a temperature of up to 1370° C., in some cases up to 1260° C. and in other cases up to 1175° C. The tubular billet can be extruded at any temperature recited above or at a temperature ranging between any of the temperatures recited above.

In another embodiment of the invention, the working, i.e., reduction ratio (created by the change of $OD_t$ to $OD_f$) in cross-sectional area, is achieved through a rotary forging process that replaces the extrusion.

In an embodiment of the invention, after working the billet, it is heat treated at a temperature of at least 815° C., in some instances at least 925° C., in some cases at least 950° C. and in other cases at least 1000° C. Also, the heat treatment can be carried out at up to 1375° C., in some cases up to 1260° C. and in other cases up to 1175° C. The heat treatment can be at any temperature or range between any temperatures recited above.

In a particular embodiment of the invention, the heat treatment is carried out at from 1250 to 1375° C.

In another particular embodiment of the invention, the heat treatment is carried out at from 815 to 960° C.

While not wishing to be limited to any single theory, under some heat treatment conditions, it is believed that subjecting the extruded tubular form to heat treatment results in recrystallization, yielding a strain-free, equiaxial grain structure.

However, in some embodiments of the invention, the heat treatment is applied for "stress-relief" purposes only.

After heat treatment, the tubular form is machined to its final dimensions. In an embodiment of the invention, the tubular-shaped sputtering target has a uniform texture which is a 110 orientation parallel to the longitudinal direction and a 111 orientation relative to the radial direction.

As indicated above, the present invention provides a source of molybdenum in the form of a tube. The tube can be used in a sputtering process whereby thin films are deposited on a substrate. In many cases, the components containing thin-film-deposited substrates are used in a flat panel display (FPD). The invention provides molybdenum in a form and with properties which were not previously available, allowing improvements in the manufacturability and the performance of the FPD's.

A particular advantage of the present tubular-shaped sputtering target is its uniform texture. The crystallographic texture of a tube made according to the invention was determined and is detailed below.

Figure 3A:
FIGS. 3A, 3B and 3C show electron backscatter diffraction (EBSD) electron micrographs relative to the longitudinal (z), radial (ND) and tangential (x) directions, respectively, of a tubular sputtering target according to the present invention.
Figure 3B:
Figure 3C:
Figure 4:
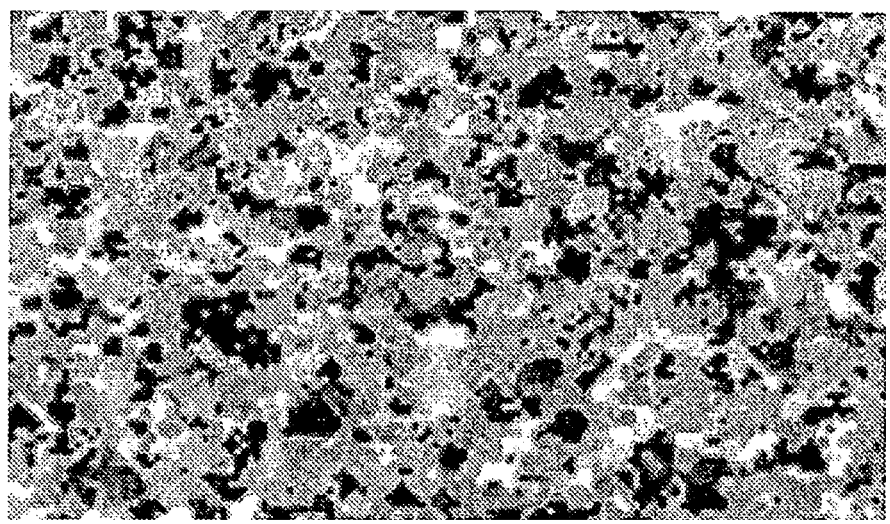
FIG. 4 shows the EBSD micrograph of 3B under higher magnification.
Figure 5:
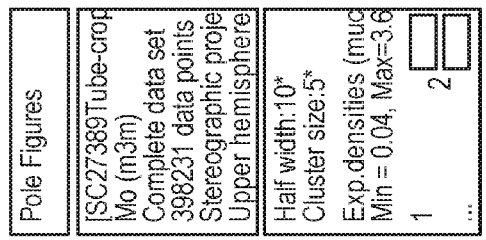
FIG. 5 shows the EBSD Pole Figure analysis of a tubular sputtering target according to the present invention.
Figure 5:
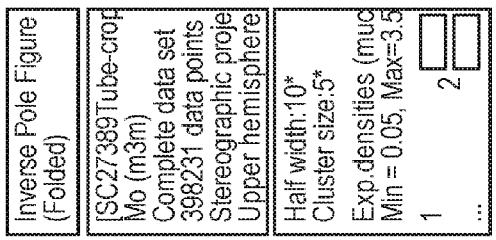
Figure 6:
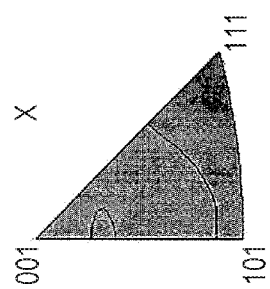
FIG. 6 shows the EBSD Inverse Pole Figure analysis of a tubular sputtering target according to the present invention.

FIGS. 3A, 3B and 3C show the texture of the sample relative to the longitudinal (z), radial (ND) and tangential (x) directions, respectively. FIG. 4 shows the top part of FIG. 3B at higher magnification, so the grains can be distinguished. FIG. 5 shows the Pole Figures, and FIG. 6 shows the Inverse Pole Figures.

The material is fully recrystallized and strain-free, as seen by the fact that there is no significant color variation within each grain. The texture is well defined, but not very strong (the highest peak is 3.6 times random). The most obvious component of texture is 110 parallel to the longitudinal direction, as seen by the predominant red in FIG. 3A. Another noticeable feature is a sharp 111 peak parallel to the radial direction. There is only the slightest variation of texture with radius. There is no banding of texture at all. The fine, uniform grain size, and the uniformity of texture through the thickness of the tube and along the length of the tube are features which distinguish the present invention from the prior art. These features allow for more uniform film deposition during sputtering operations.

Thus, the present invention provides a sputtering target having a uniform and fine texture and grain structure. In an embodiment of the invention, the grain size is at least 22 µm, and in some cases at least 45 µm. More importantly, however, the average grain size is not more than 125 µm, in some cases not more than 90 µm and in other cases not more than 65 µm. When the grain size is too large, thin films formed from sputtering the present sputtering target will not have the desired uniform texture and/or film thickness. The grain size in the present sputtering target can be any value or range between any values recited above.

Embodiments of the invention are also directed to a novel method of manufacturing molybdenum sputtering targets, which produces performance superior to that which is presently known in the art. This method of manufacture involves the use of pure molybdenum powder as a starting material and its consolidation to a substantially fully dense article in the form of a plate. The inventive plate, which is produced through a multi-directional thermomechanical working process as described below, has a fine, uniform grain size and a texture which is substantially uniform throughout the plate. Such plates yield thin films that have the required purity, and a thickness that is both easily predictable and uniform across the area of the substrate.

In an embodiment of the invention, the plates have a texture that is substantially free of banding and substantially free of any through thickness gradient.

In the present multi-directional thermomechanical working process, ammonium dimolybdate is reduced to molybdenum metal powder in hydrogen using methodologies well known in the art. In an embodiment of the invention, the ammonium dimolybdate is 99.95%, in some cases 99.9% and in other cases 99.5% pure.

Thus, in a first step I), the molybdenum powder is placed in a mold and pressed at a pressure of at least 100 MPa, in some cases at least 200 MPa and in other cases at least 250 MPa. Also, the powder can be pressed at a pressure of up to 275 MPa. The molybdenum powder in the mold can be pressed at any pressure recited above or at pressures ranging between any of the pressures recited above.

Further, after the molybdenum powder is pressed in the mold, it is sintered at a temperature of at least 1785° C. Also, the powder can be sintered at a temperature of up to 2175° C., in some cases up to 2200° C. The pressed molybdenum workpiece can be sintered at any temperature recited above or at temperatures ranging between any of the temperatures recited above.

In an embodiment of the invention, the pressing is performed isostatically. In another embodiment of the invention, the pressed powder is sintered in hydrogen. Thus, the molybdenum metal powder can be placed in a rubber mold, isostatically pressed and the pressed piece then sintered in hydrogen to form a billet with a cross-sectional area which can be from 1.5 to 4, in some cases from 2 to 3, and in a particular embodiment approximately 2.4 times the size of the intended target cross-sectional area of the eventual sputtering target. In other words, the billet has a diameter of $D_o$.

The billet is then preheated, prior to extruding, to a temperature of at least 900° C., in some cases 925° C. and in other cases at least 950° C. Also, the billet can be preheated to a temperature of up to 1260° C., in some cases 1225° C. and in other cases up to 1175° C. The preheated temperature can be any value or can range between any values recited above.

Figure 7:
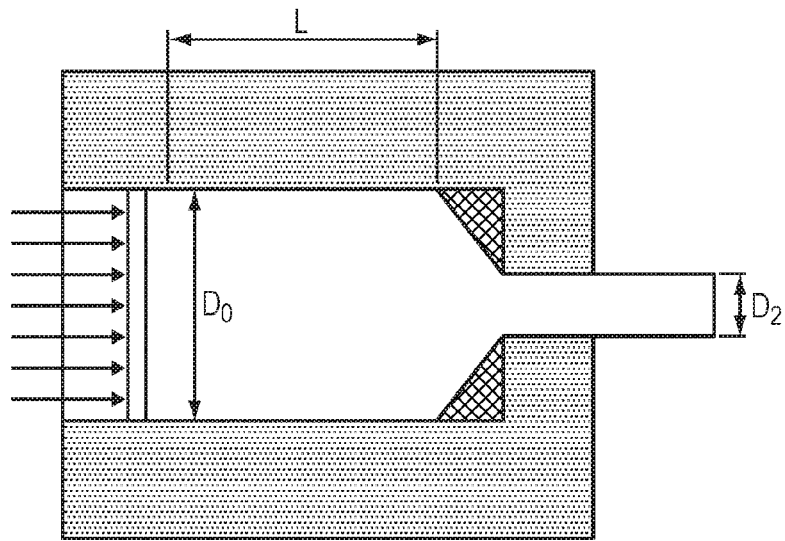
FIG. 7 is a schematic showing a solid billet being extruded according to the invention for intermediate work pieces.

As shown in FIG. 7, the billet is extruded to form an extruded billet having a diameter of $D_2$, such that the ratio of reduction ($D_o:D_2$) in cross-sectional area is at least 2.5:1, in some cases at least 3:1 and in other cases at least 3.5:1. Also, the ratio of reduction can be up to 12:1, in some cases 10:1 and in other cases up to 8:1. The ratio of reduction can be any value or range between any values recited above. The billet length can be variable.

In an alternative embodiment, rotary forging or hammer forging can be used in place of the extrusion operation to provide a billet with the aforementioned ratio of reduction ($D_o:D_2$) in cross-sectional area.

In order to prepare the extruded billet for upset forging, it is subjected to a first heat treatment step. This heat treatment step generally provides stress relief.

The first heat treatment is conducted at a temperature of at least 800° C., in some cases at least 815° C., in some cases at least 830° C. and in other cases at a temperature of at least 850° C. Also, the first heat treatment can be conducted at a temperature up to 960° C., in some cases up to 930° C. and in other cases up to 900° C. The temperature of the first heat treatment step can be any value recited above or can range between any values recited above.

The billet is also cut to a length so that it will not buckle. In an embodiment of the invention, the billet is cut to a length such that the billet's aspect ratio (Length/Diameter) is less than or equal to 2.0, in some cases less than or equal to 1.6.

After the first heat treatment and before upset forging, the heat-treated extruded billet is preheated to a temperature of at least 900° C., in some cases at least 925° C., in other cases at least 950° C., in some situations at least 975° C. and in other cases at least 1000° C. Also, the heat-treated extruded billet can be preheated to a temperature of up to 1300° C., in some cases up to 1260° C., in other cases up to 1200° C. and in some instances up to 1150° C. Prior to upset forging, the heat-treated extruded billet can be preheated to any temperature recited above or can range between any temperature recited above.

Figure 8A:
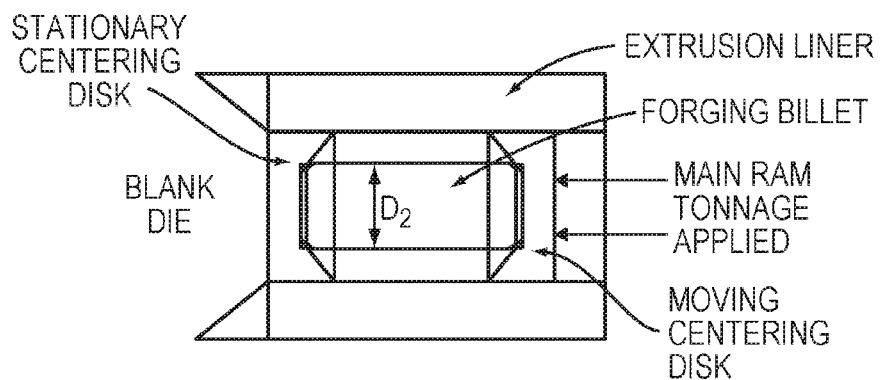
FIGS. 8A and 8B show schematic views of upset forging a billet according to the present invention.
Figure 8B:
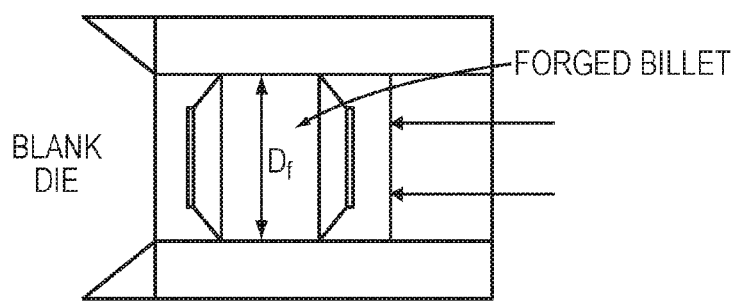

As shown in FIGS. 8A and 8B, the heat-treated extruded billet is subjected to upset forging such that the ratio of $D_2$, the heat-treated extruded billet cross-sectional area, to $D_f$, the forged billet cross-sectional area, is from 1:1.5 to 1:3, in some cases 1:1.75 to 1:2.5, and in other cases from 1:1.8 to 1:2.25. In an embodiment of the invention, the ratio of $D_2$ to $D_f$ is approximately 1:2±0.2. Specifically, FIG. 8A shows the billet at the start of the upset forging process and FIG. 8B shows the billet at the end of the upset forging process.

The upset forging of the extruded billet is carried out at a temperature of at least 800° C., in some cases at least 900° C., in other cases at least 925° C. and in some instances at least 950° C. Also, the upset forging of the extruded billet can be carried out at up to 1300° C., in some cases up to 1260° C., in other cases up to 1200° C., in some instances up to 1100° C. and in other instances up to 1000° C. The forging temperature allows the billet to be forged to form a forged billet having a diameter $D_f$ as described above. The forging temperature can be any temperature described above or can range between any of the temperatures recited above.

After forging, the forged billet is subjected to a second heat treatment step. The second heat treatment step is a recrystallization step that provides a strain-free equiaxial grain structure. The second heat treatment is conducted at a temperature of at least 1200° C., in some cases at least 1250° C., in some cases at least 1275° C. and in other cases at a temperature of at least 1300° C. Also, the second heat treatment can be conducted at a temperature up to 1400° C., in some cases up to 1375° C. and in other cases up to 1350°

C. The temperature of the second heat treatment step can be any value recited above or can range between any values recited above.

In an alternative embodiment, the second heat treatment provides stress relief only and not recrystallization. In this embodiment, the heat treatment is carried out at a temperature of at least 800° C., in some cases 815° C. and in other cases at least 850° C. Also, the heat treatment can be carried out at a temperature of up to 1000° C., in some cases up to 960° C. and in other cases up to 925° C. The temperature of the second heat treatment step under this embodiment can be any value recited above or can range between any values recited above.

As indicated above, the second heat treatment is applied at a temperature and for a time that provides a billet that has a strain-free equiaxial grain structure. Thus, after the second heat treatment, a billet is provided that is completely recrystallized and strain free.

Figure 9A:
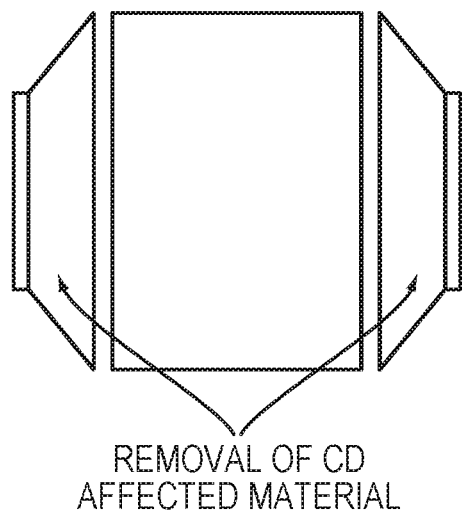
FIGS. 9A and 9B show sputtering target plates according to the present invention being cut from forged billets.
Figure 9B:
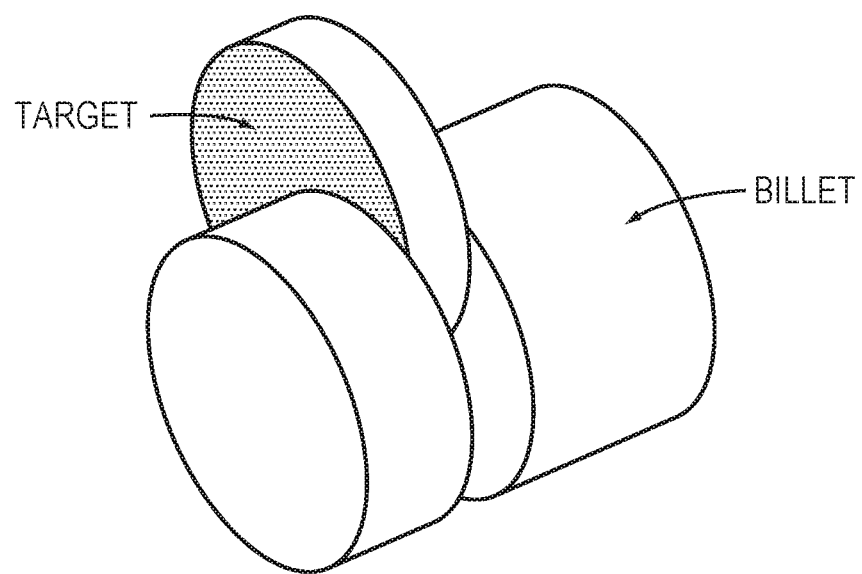

As shown in FIG. 9A, material affected during upset forging by the centering disks (CD) is removed. The material affected by the centering disks is not generally usable as target material. Sputtering targets are sliced from the billet according to the orientation shown in FIG. 9B. The entirety of the billet is usable as target once the centering disk affected material is removed.

Figure 10A:
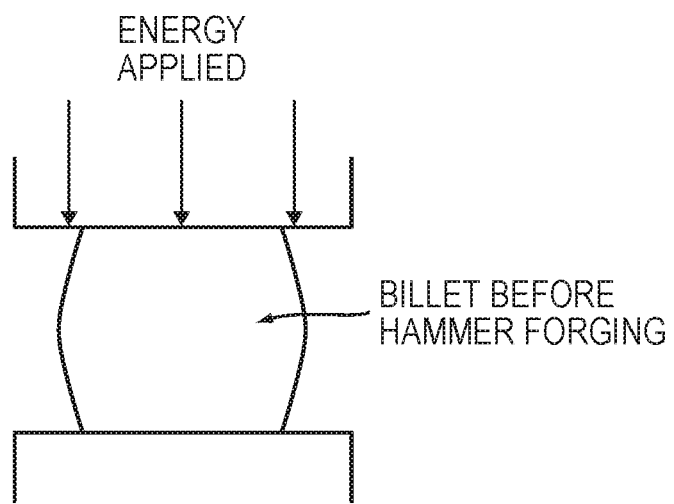
FIGS. 10A and 10B show a billet being hammer forged according to one embodiment of this invention.
Figure 10B:
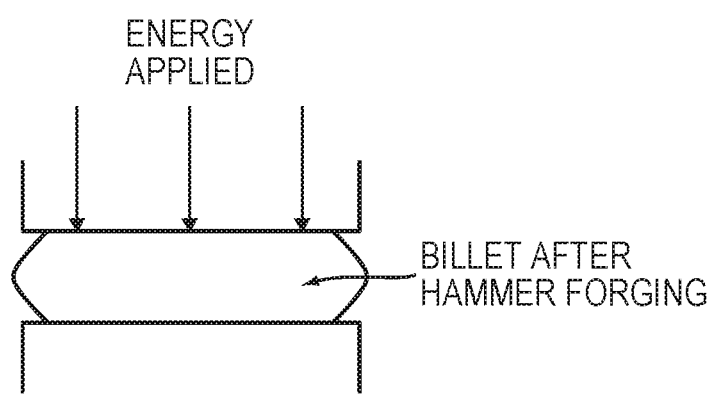

In an alternative embodiment as shown in FIGS. 10A and 10B, the upset forging operation is replaced by a hammer/upset forging such that the ratio of $D_2$, the heat-treated extruded billet cross-sectional area, to $D_f$, the forged billet cross-sectional area, is as described above. FIG. 10A shows the billet at the start of the hammer forging operation and FIG. 10B shows the billet after the hammer forging operation. After the hammer forging operation, the billet is given a second heat treatment as described above. In other words, a disc-shaped portion is cut from the heat-treated forged billet to provide a disc-shaped sputtering target.

The grain and texture of the resulting sputtering target is generally analyzed using electron backscatter diffraction (EBSD). Because of the above-described process, the grain and texture from target to target is very consistent. The targets are typically sampled from the center, mid-radius, and edge on the XZ plane, i.e., the radial-axial plane.

In an embodiment of the present invention, a sputtering target is provided having a uniform and fine texture and grain structure. In an embodiment of the invention, the grain size is at least 22 μm and in some cases at least 65 μm. More importantly, however, the average grain size is not more than 125 μm, in some cases not more than 90 μm and in other cases not more than 65 μm as determined by electron backscatter diffraction. When the grain size is too large and/or non-uniform, thin films formed from sputtering the present sputtering target will not have the desired uniform texture and/or film thickness. The grain size in the present sputtering target can be any value or range between any values recited above.

The present invention also provides a method of making a sputtering target including the steps, as described above, of:
 I) placing molybdenum powder in a mold and pressing the powder at the pressures indicated above and sintering the pressed piece at temperatures indicated above to form a billet having a diameter of $D_o$;
 II) extruding the billet to form an extruded billet having a diameter of $D_2$ such that the ratio of $D_o$ to $D_2$ is as indicated above;
 III) applying a first heat treatment to the extruded billet at the temperatures indicated above;
 IV) upset forging the extruded billet at the temperatures indicated above to form a forged billet having a diameter $D_f$ such that the ratio of $D_f$ to $D_2$ is as indicated above;
 V) applying a second heat treatment to the forged billet at the temperatures indicated above; and optionally
 VI) cutting a disc-shaped portion from the heat-treated forged billet to provide a disc-shaped sputtering target.

Embodiments of the invention provide large molybdenum plates having a non-segmented construction. As used herein, the term "non-segmented" refers to plates made in one piece and not to plates made by combining or joining two or more plates. Typically, the present plates weigh at least 300 kg, in some cases at least 350 kg and in other cases at least 400 kg. The plates according to the invention include at least 99%, in some cases at least 99.5% and in other cases at least 99.9% by weight of molybdenum.

In an embodiment of the invention, the large molybdenum plates have a fine, uniform grain size where the average grains are not more than 100 μm, in some cases not more than 60 μm, and in other cases not more than 20 μm. In this embodiment, the grain size can be at least 5 μm and in some cases at least 10 μm. The grain size can be any value recited above or range between any values recited above.

In an embodiment of the invention, the large molybdenum plates include a backing plate to provide support.

In another embodiment of the invention, the large plate has a texture that is substantially free of banding and substantially free of any through thickness gradient.

In an embodiment of the invention, the plates have a rectangular cross-sectional shape and have a length of at least 0.8 m, in some cases at least 1.2 m and in other cases at least 2 m and up to 2.6 m, in some cases up to 3.4 m and in other cases up to 4 m; a width of at least 0.7 m, in some cases at least 0.9 m and in other cases at least 1.2 m and up to 1.7 m, in some cases up to 2.0 m and in other cases up to 2.5 m; and a height (thickness) of at least 0.008 m, in some cases at least 0.012 m and in other cases at least 0.018 m and up to 0.020 m, in some cases up to 0.032 m and in other cases up to 0.064 m. The dimensions of the rectangular plate can be any of the values recited above and can range between any of the values recited above.

In another embodiment of the invention, the plates have a square cross sectional shape and have a length of at least 0.8 m, in some cases at least 1.0 m and in other cases at least 1.2 m and up to 1.6 m, in some cases up to 2.0, in some situations up to 2.5 m, and in other cases up to 3.0 m; a substantially equal width and height (thickness) of at least 0.008 m, in some cases at least 0.012 m and in other cases at least 0.018 m and up to 0.020 m, in some cases up to 0.032 m and in other cases up to 0.064 m. The dimensions of the square plate can be any of the values recited above and can range between any of the values recited above.

In another embodiment of the invention, a portion can be cut from the plate to form either a circular or cylindrical cross-sectional shaped portion having a length (thickness) of at least 0.008 m, in some cases at least 0.010 m and in other cases at least 0.012 m and up to 0.018 m, in some cases up to 0.032 m and in other cases up to 0.064 m; and a diameter of at least 0.7 m, in some cases at least 0.9 m and in other cases at least 1.2 m and up to 1.75 m, in some cases up to 2.0 m, in other cases up to 2.5 m, and in some instances up to 3.0 m. The dimensions of the circular portion can be any of the values recited above and can range between any of the values recited above.

As is known in the art and regardless of the particular shape of the sputtering target, when the dimensions of the sputtering target reach a size where support is needed, a backing plate is included with the sputtering target.

In making the large molybdenum plate according to the invention, molybdenum powder is used. The powder is prepared by thermal and hydrogen reduction of ammonium molybdate that is at least 99%, in some cases at least 99.5% and in other cases at least 99.9% pure to produce molybdenum metal powder. The powder is typically screened to produce a particle morphology and size distribution to sinter. The particle size typically has a weight average value of at least 0.1 µm, in some cases at least 0.5 µm, in other cases at least 1 µm, in some instances at least 5 µm, in other instances at least 10 µm, in some situations at least 15 µm and in other situations at least 20 µm. Also, the particle size typically has a weight average value and up to 150 µm, in some cases up to 125 µm, in other cases up to 100 µm, in some instance up to 75 µm, in other instances up to 50 µm and in some situations up to 40 µm. The particle size of the powder can be any of the values recited above and can range between any of the values recited above.

The particle morphology can typically be described as irregularly-shaped agglomerates of fine particles.

The molybdenum powder is poured into a sheet bar mold and jolted/tapped.

The molybdenum powder is then consolidated by cold isostatic pressing (CIP) at a pressure of at least 100, in some cases at least 125 and in other cases at least 150 Mpa. Also, the CIP pressure can be up to 250, in some cases up to 225, and in other cases up to 200 Mpa. The CIP pressure is a pressure sufficient to form a sheet bar. The CIP pressure can be any value recited above or range between any values recited above.

After the CIP process, the sheet bar is sintered at a temperature of at least 1600° C., in some cases 1650° C. and in other cases at least 1700° C. Also, the sintering temperature can be up to 1800° C., in some cases up to 1750° C. and in other cases up to 1725° C. The sintering temperature is a temperature sufficient to form an ingot having a density of at least 90% of the theoretical density. The sintering temperature can be any temperature or range between any temperatures recited above.

The sintering is performed for at least 4, in some cases at least 10 and in other cases at least 16 hours. Also, the sintering is performed for up to 32, in some cases up to 24 and in other cases up to 20 hours. The time for sintering is a length of time sufficient to achieve at least 90% of the theoretical density. The length of time for sintering can be any value recited above or range between any values recited above.

The sintered bar, or ingot, is preheated to a temperature of at least 1100° C., in some cases at least 1150° C. and in other cases at least 1200° C. Also, the ingot can be preheated to a temperature of up to 1450° C., in some cases up to 1350° C. and in other cases up to 1300° C. The ingot can be preheated to any temperature or range between any temperatures recited above.

The preheated ingot is hot rolled at a temperature of at least 1050° C., in some cases at least 1100° C. and in other cases at least 1150° C. Also, the ingot can be hot rolled at a temperature of up to 1400° C., in some cases up to 1300° C. and in other cases up to 1250° C. The hot rolling effects a reduction in the thickness and an increase in the length of the ingot. The hot rolling temperature can be any value or range between any value recited above.

The reduction achieve from hot rolling can be at least 50%, in some cases 75% and in other cases at least 98% of the thickness of the pre-hot rolled ingot.

Also, the length of the ingot can increase at least 50%, in some cases at least 75% and in other cases at least 150% and can increase up to 300%, in some cases up to 400% and in other cases up to 500%. The length of the ingot can increase to any value or range between any of the values recited above.

The thickness of the hot rolled ingot can be further reduced by subsequent reduction, maintaining the integrity of the plate. The subsequent reduction can be at least 10%, in some cases at least 15% and in other cases at least 20% and can be up to 30%, in some cases up to 28% and in other cases up to 25% of the hot rolled ingot thickness. The subsequent reduction can be any value or range between any of the values recited above.

During the rolling reduction process, the plates can be reheated to maintain the temperatures indicated above. Typically, the plates are inspected for integrity throughout the rolling process. Also, the plates can be precision leveled to achieve optimum flatness for subsequent machining/grinding operations in order to achieve the desired final dimensions.

The roll reduced ingot is heat treated at a temperature of at least 850° C., in some cases at least 860° C. and in other cases at least 880° C. and can be up to 950° C., in some cases up to 920° and in other cases up to 900° C. This heat treatment step can be carried out any temperature or range between any of the temperatures recited above.

The roll reduced ingot heat treatment is performed for at least 30 minutes, in some cases at least 45 minutes and in other cases at least 60 minutes. Also, the heat treatment can be performed for up to 180 minutes, in some cases up to 120 minutes and in other cases up to 90 minutes. The length of time for the heat treatment can be any value recited above or range between any values recited above.

During or after the above-described process, the integrity of an ingot can be conducted using ultrasonic techniques.

In an embodiment of the invention, in preparing any of the sputtering targets described above, microalloys can be included in the molybdenum powder prior to pressing. Non-limiting examples of suitable microalloys include those comprising one or more metallic materials selected from Ta, Nb, Cr, W and/or V. In a particular embodiment of the invention, the microalloy has a body-centered cubic (BCC) structure.

When microalloys are used they are typically processed by adding one or more metallic materials into the molybdenum powder before the powder pressing stage described above. The described steps in forming ingots or billets are followed as indicated above.

When microalloys are used, they are included in amounts that provide the particular properties desired. As such, the metallic materials can be included at up to 1000 ppm, in some cases up to 750 ppm, in other cases up to 500 ppm, in some situations up to 300 ppm, in other situations up to 150 ppm, and in some instances up to 75 ppm. Also, when included, the metallic materials can be included at a level of at least 10 ppm, in some cases at least 20 ppm and in other cases at least 25 ppm.

When microalloys are included, they are typically included to provide particular affects on the molybdenum that is finally produced. As a non-limiting example, the molybdenum can take on a BCC structure by intentionally adding W, V and/or Cr or combinations thereof. These BCC metallic elements, when included with the molybdenum, create a localized lattice stress. The stress decreases the energy barrier for (a) atoms leaving the sputtering targets when sputtering (i.e. increasing the sputtering rates of the targets), and (b) the etch of thin film during photolithographic processes (for example by either liquid etch or dry etch, such as by plasma etch or reactive etch). When the microalloy is included, it is included at a level that provides the above-described effect, but not at a level that would compromise any properties of the film produced.

Additionally, the present invention provides a method of sputtering, whereby any of the above-described sputtering targets are subjected to sputtering conditions and are thereby sputtered.

Any suitable sputtering method can be used in the present invention. Suitable sputtering methods include, but are not limited to, magnetron sputtering, pulse laser sputtering, ion beam sputtering, triode sputtering, and combinations thereof.

The present invention also provides a method of making a thin film including the steps of:
(a) sputtering the above-described sputtering target;
(b) removing Mo atoms from the target; and
(c) forming a thin film comprising molybdenum onto a substrate.

In an embodiment of the invention, after (b), a step including supplying a reactive gas to the Mo can be added. A reactive gas is a gas that includes a component that can react with the molybdenum either in a gaseous state or once deposited onto a substrate to form a molybdenum compound. As a non-limiting example, the reactive gas can be oxygen, nitrogen and/or a silicon containing gas.

The thin film applied by the present method can have any desired thickness. The thickness of the thin film will depend on the end use application desired. Typically, the thickness of the thin film can be at least 0.5 nm, in some situations 1 nm, in some cases at least 5 nm, in other cases at least 10 nm, in some situations at least 25 nm, in other situations at least 50 nm, in some circumstance at least 75 nm and in other circumstances at least 100 nm. Also, the film thickness can be up to 10 µm, in some cases up to 5 µm, in other cases up to 2 µm, in some situations up to 1 µm and in other situations up to 0.5 µm. The film thickness can be any of the stated values or can range between any of the values stated above.

The thin film can be or be part of a flat panel display.

Due to the uniformity of grain size and texture through the thickness of the molybdenum sputtering targets, the films obtained from such targets have excellent uniformity.

In a particular embodiment of the invention a very thin film is provided. In this embodiment, the thin film is at least 100 Å, in some cases at least 250 Å and in other cases at least 500 Å. In this embodiment, the thin film can be up to 5,000 Å, in some cases up to 3,000 Å, in other cases up to 2,500 Å and in some situations up to 2,000 Å.

Any suitable substrate may be used in the invention. Suitable substrates for the thin film used in the flat panel display devices (FPD) include, but are not limited to, flexible foils, plastic substrates, glass substrates, ceramic substrates, and combinations thereof. The plastic substrates include, but are not limited to, polynorbomene, polyimide, polyarylate, polycarbonate, polyethylenenaphthanate (PEN), polyethyleneterephthalate (PET), and the like. A non-limiting example of a ceramic substrate includes sapphire.

In addition to molybdenum thin films on various substrates, $MoO_x$ (oxidation), $MoN_x$ (nitridation), $MoSi_x$ (silicidation) can also be produced by reactive sputtering or ion implantation.

The invention encompasses products used in various applications. In one embodiment, a thin film made in accordance with the invention can be used in thin film transistor (TFT)-liquid crystal display (LCD) applications. Also, in another embodiment, the invention encompasses a thin film used in solar cell applications, sensor applications, semiconductor devices and metal gates for CMOS technology (complementary metal oxide semiconductor). In one embodiment, the invention is directed to a TFT-LCD device containing molybdenum thin films that serve as gate electrodes that have excellent uniformity. Another embodiment is directed to thin film solar cell applications, where the invention encompasses solar cells in which Mo thin films function as a back contact for the following illustrative device structure: $MoO_2$ containing front contact/p-layer/junction layer/n-layer/Mo back contact, in which the p-layer releases electrons when it is struck by light, resulting in a lack of electrons, and p-layer is negatively charged.

In sensor applications, an $MoO_3$ film can be produced by reactive sputtering from a Mo target for use as a gas sensor, such as for ammonia detection. In another embodiment, the invention encompasses either molybdenum or nitrided molybdenum films used as gate devices for CMOS processes (complementary metal oxide semiconductor) with a tunable work function depending on the nitrogen-doping level.

When improving the picture quality of a FPD, increasing the contrast in bright settings is easier than increasing display brightness. An $MoO_x$ film can be used to form a black matrix by reactive sputtering from molybdenum sputtering target to enhance image contrast. Traditionally, either Cr or $CrO_2$ target is used to form a black matrix in Flat Panel Display, which has both health and environmental concerns.

The invention and various embodiments thereof have been described above. It will be obvious to those skilled in the art that various changes and modifications may be made therein without departing from the scope of the invention as defined in the specification and the appended claims.

What is claimed is:

1. A method of making a sputtering target, the method comprising:
   introducing molybdenum powder into a sheet bar mold;
   pressing the powder to form a sheet bar;
   sintering the sheet bar at a first temperature to form an ingot having a density of at least 90% of a theoretical density;
   preheating the ingot at a second temperature;
   rolling the ingot, whereby a thickness of the ingot is reduced, to form a plate; and
   heat treating the plate at a third temperature.

2. The method of claim 1, wherein the powder is pressed at a pressure selected from the range of 100 MPa to 250 MPa.

3. The method of claim 1, wherein the powder is pressed at a pressure of at least 100 MPa.

4. The method of claim 1, wherein pressing the powder comprises cold isostatic pressing.

5. The method of claim 1, wherein the first temperature is at least 1600° C.

6. The method of claim 1, wherein the first temperature is selected from the range of 1600° C. to 1800° C.

7. The method of claim 1, wherein the sheet bar is sintered for a time period of at least 4 hours.

8. The method of claim 1, wherein the second temperature is selected from the range of 1100° C. to 1450° C.

9. The method of claim 1, wherein the second temperature is at least 1100° C.

10. The method of claim 1, wherein rolling the ingot comprises hot rolling the ingot at a fourth temperature.

11. The method of claim 10, wherein the fourth temperature is selected from the range of 1050° C. to 1400° C.

12. The method of claim 10, wherein the fourth temperature is at least 1050° C.

13. The method of claim 1, wherein rolling the ingot reduces the thickness of the ingot by at least 50%.

14. The method of claim 1, wherein the third temperature is selected from the range of 850° C. to 950° C.

15. The method of claim 1, wherein the third temperature is at least 850° C.

16. The method of claim 1, wherein the plate is heat treated for a time period of at least 30 minutes.

17. The method of claim 1, further comprising providing the molybdenum powder by reducing ammonium dimolybdate.

18. The method of claim 1, further comprising pressing an additional powder with the molybdenum powder, the additional powder comprising at least one of tantalum, niobium, chromium, tungsten, or vanadium.

19. The method of claim 18, wherein an amount of the additional powder, relative to a total amount of molybdenum powder and additional powder, is at least 10 ppm.

20. The method of claim 18, wherein an amount of the additional powder, relative to a total amount of molybdenum powder and additional powder, is approximately 1000 ppm or less.

21. The method of claim 1, further comprising attaching at least a portion of the plate to a backing plate.

22. The method of claim 1, wherein the plate has a texture that is substantially free of banding and substantially free of any through thickness gradient.

23. The method of claim 1, wherein a grain size of the plate is substantially uniform.

24. The method of claim 1, wherein an average grain size of the plate is no more than 100 μm.

25. The method of claim 1, further comprising removing a portion from the plate, a cross-section of the portion being substantially circular or substantially cylindrical.

* * * * *